(12) United States Patent
Huang et al.

(10) Patent No.: US 8,865,500 B2
(45) Date of Patent: Oct. 21, 2014

(54) METHOD OF FABRICATING A MEMS MICROPHONE WITH TRENCHES SERVING AS VENT PATTERN

(75) Inventors: Chien-Hsin Huang, Taichung (TW); Bang-Chiang Lan, Taipei (TW); Hui-Min Wu, Hsinchu County (TW); Tzung-I Su, Yun-Lin County (TW); Chao-An Su, Kaohsiung County (TW); Tzung-Han Tan, Taipei (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 896 days.

(21) Appl. No.: 12/699,797

(22) Filed: Feb. 3, 2010

(65) Prior Publication Data
US 2011/0189804 A1  Aug. 4, 2011

(51) Int. Cl.
*H01L 21/30*     (2006.01)
(52) U.S. Cl.
CPC ...................................... *H01L 21/30* (2013.01)
USPC .................................... 438/53; 257/E21.211
(58) Field of Classification Search
CPC .... H04R 19/005; H04R 21/02; H04R 31/006; B81B 2201/0257; B81B 2207/015; B81C 1/00246; B81C 2203/0714; H01L 21/30
USPC ......................................................... 438/53
See application file for complete search history.

(56) References Cited

U.S. PATENT DOCUMENTS

| | | | |
|---|---|---|---|
| 6,936,524 B2 | 8/2005 | Zhu | |
| 7,049,051 B2 | 5/2006 | Gabriel | |
| 7,280,436 B2 | 10/2007 | Pedersen | |
| 2002/0106906 A1 * | 8/2002 | Ballantine et al. | 438/770 |
| 2005/0101100 A1 * | 5/2005 | Kretchmer et al. | 438/424 |
| 2005/0287760 A1 * | 12/2005 | Yan et al. | 438/404 |
| 2006/0237806 A1 * | 10/2006 | Martin et al. | 257/415 |
| 2008/0081404 A1 * | 4/2008 | Barna et al. | 438/197 |
| 2008/0087931 A1 * | 4/2008 | Cho et al. | 257/306 |
| 2009/0179233 A1 * | 7/2009 | Lee et al. | 257/254 |
| 2010/0330722 A1 * | 12/2010 | Hsieh et al. | 438/53 |

FOREIGN PATENT DOCUMENTS

TW   200711545   3/2007

* cited by examiner

*Primary Examiner* — Duy T Nguyen
(74) *Attorney, Agent, or Firm* — Winston Hsu; Scott Margo

(57) ABSTRACT

A method of fabricating a MEMS microphone includes: first providing a substrate having a first surface and a second surface. The substrate is divided into a logic region and a MEMS region. The first surface of the substrate is etched to form a plurality of first trenches in the MEMS region. An STI material is then formed in the plurality of first trenches. Subsequently, the second surface of the substrate is etched to form a second trench in the MEMS region, wherein the second trench connects with each of the first trenches. Finally, the STI material in the first trenches is removed.

10 Claims, 4 Drawing Sheets

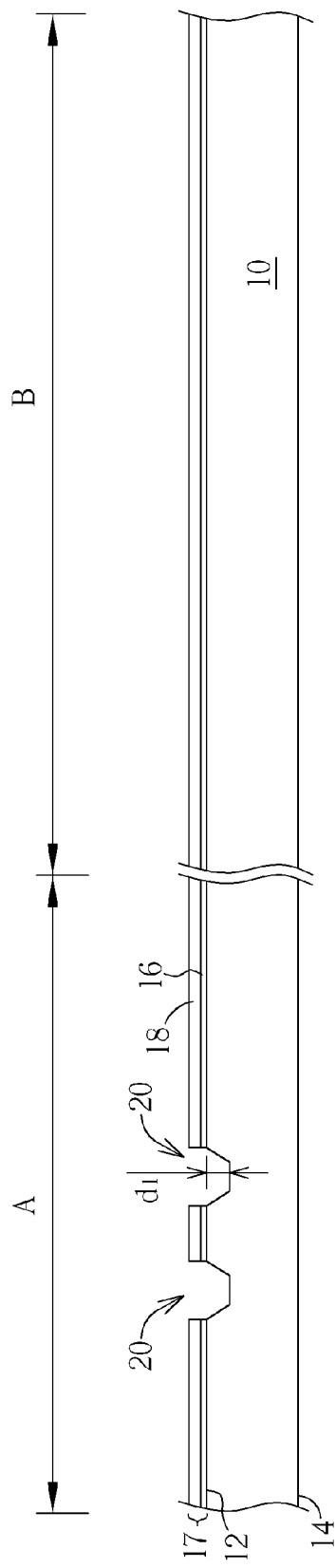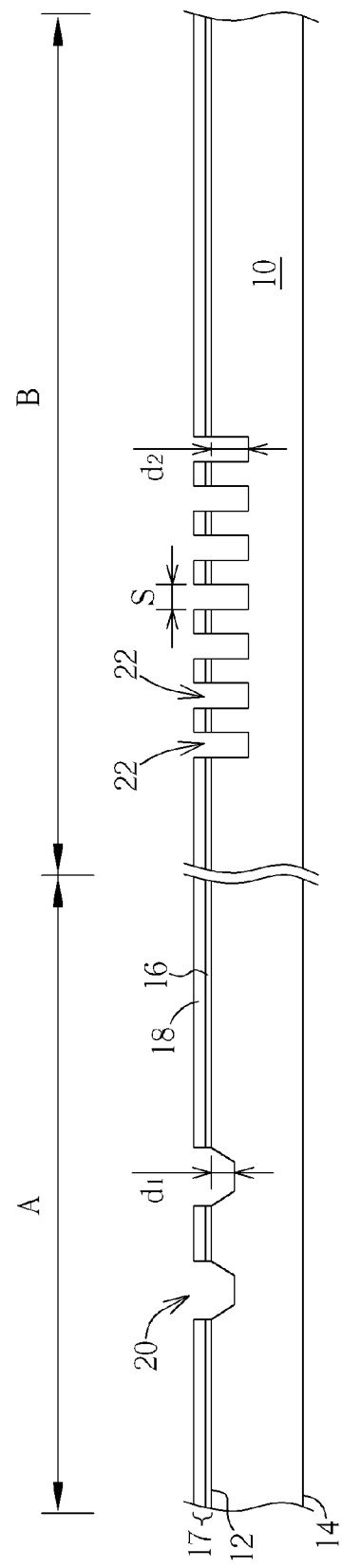

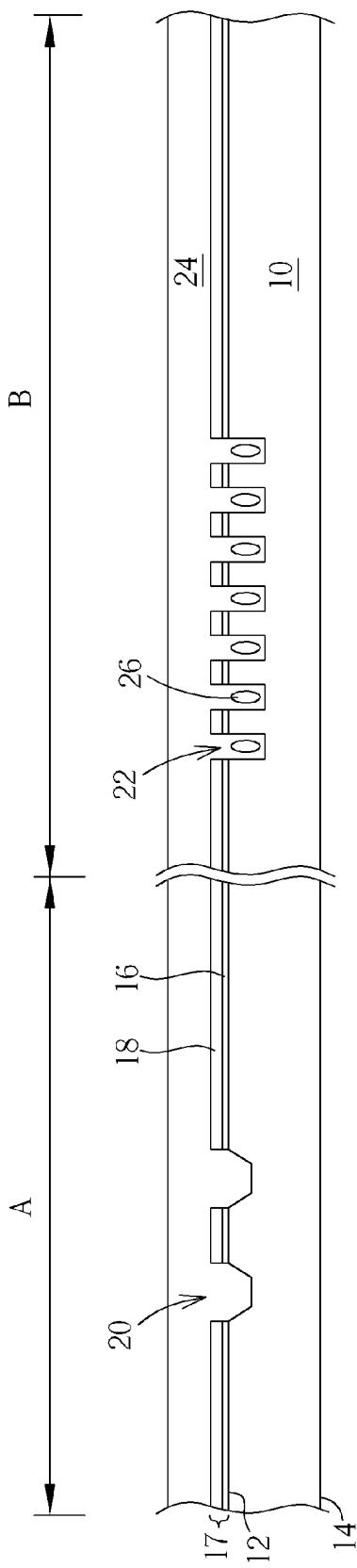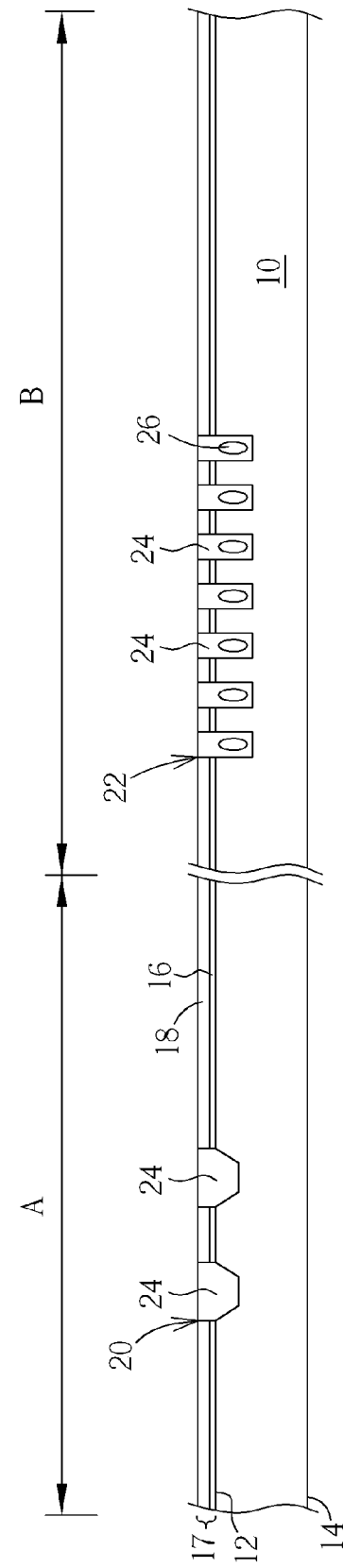

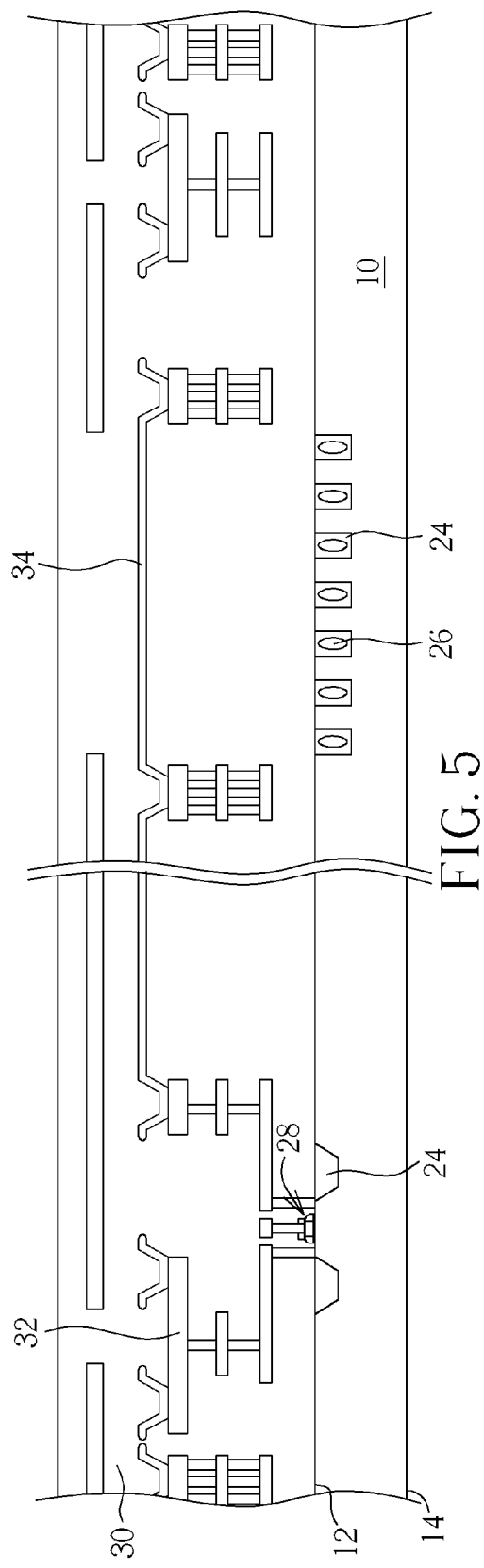
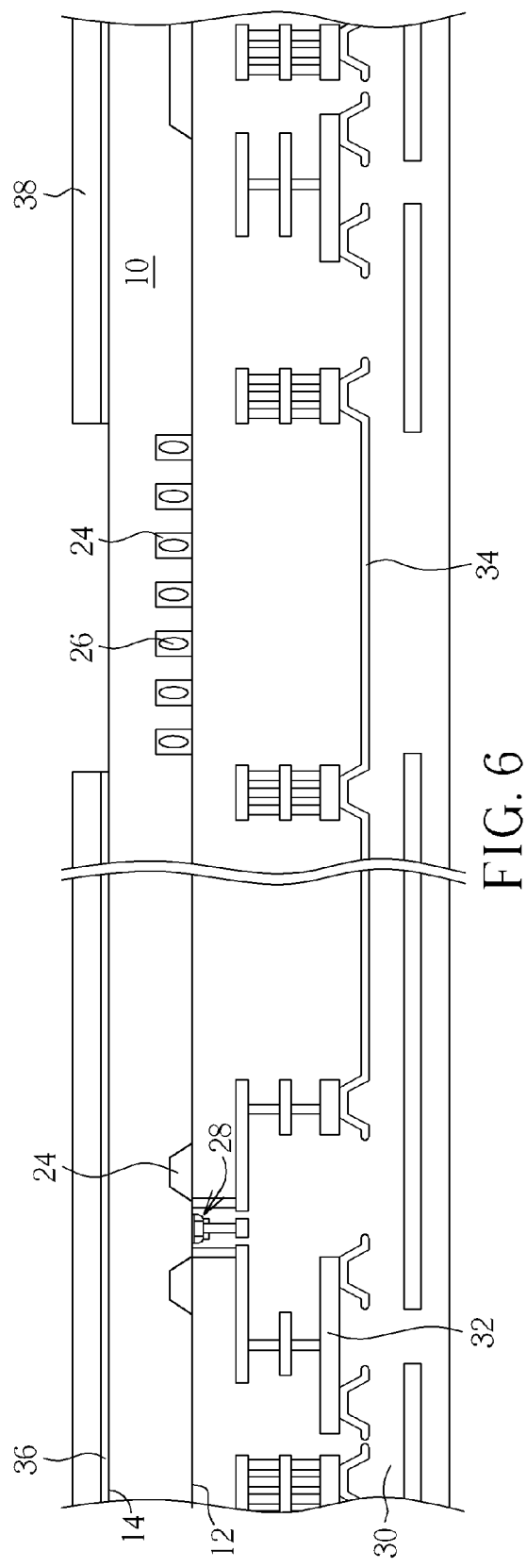

METHOD OF FABRICATING A MEMS MICROPHONE WITH TRENCHES SERVING AS VENT PATTERN

BACKGROUND OF THE INVENTION

1. Field of the Invention

The present invention relates to a fabricating method of a MEMS device, and more particularly, to a fabricating method of a MEMS microphone.

2. Description of the Prior Art

Microphones are electromechanical transducers that convert an incident pressure into a corresponding electrical output. There are many well-established transduction principles but the condenser microphone stands out due to its high sensitivity, low power consumption, high noise immunity and flat frequency response.

MEMS microphones work on a principle of variable capacitance and voltage by the movement of an electrically charged diaphragm relative to a backplate electrode in response to sound pressure.

Generally, the position which the diaphragm and the logic device is located is called the front side of the wafer. The side which does not have the logic device is called the backside of the wafer. Recent MEMS microphones form the backplate electrode after the formation of the diaphragm, the logic device and the metal interconnections. However, in the conventional fabricating method, the step of forming the trenches from the backside of the wafer requires a longer fabricating time.

SUMMARY OF THE INVENTION

It is therefore one objective of the present invention to provide a fabricating method to reduce the fabricating time of the MEMS microphone and scale down the size of the backplate electrode.

According to a preferred embodiment of the present invention, the method of fabricating a MEMS microphone includes: providing a substrate having a first surface and a second surface. The substrate is divided into a logic region and a MEMS region. Then, a pad oxide layer and a silicon nitride layer are formed on the first surface of the substrate in sequence. After that, the pad oxide layer and the silicon nitride layer are patterned to expose part of the logic region. The first surface of the substrate is etched to form a third trench in the logic region by taking the pad oxide and the silicon nitride as a mask. Then, the pad oxide layer and the silicon nitride layer are patterned again to expose part of the MEMS region. A plurality of first trenches is subsequently formed by etching the first surface and taking the pad oxide layer and the silicon nitride layer as a mask. Then, an insulating material is formed in the third trench and the first trenches. Next, the pad oxide layer and the silicon nitride layer are removed. Then, at least one logic device is formed in the logic region. Subsequently, an inter-metal dielectric layer is formed and a plurality of metal interconnections and a diaphragm are formed in the inter-metal dielectric layer. The second surface of the substrate is then etched to form a second trench in the MEMS region. Finally, part of the inter-metal dielectric layer in the MEMS region and the insulating material in the first trench are removed.

The first trenches and the second trench serve as the vent pattern of a MEMS microphone. In the present invention, the first trenches are formed by etching the front side of the substrate, and the second trench is formed by etching the backside of the substrate. In this way, a time for forming the vent pattern can be reduced.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 are diagrams schematically depicting the method of fabricating a MEMS microphone.

DETAILED DESCRIPTION

Figure 7:
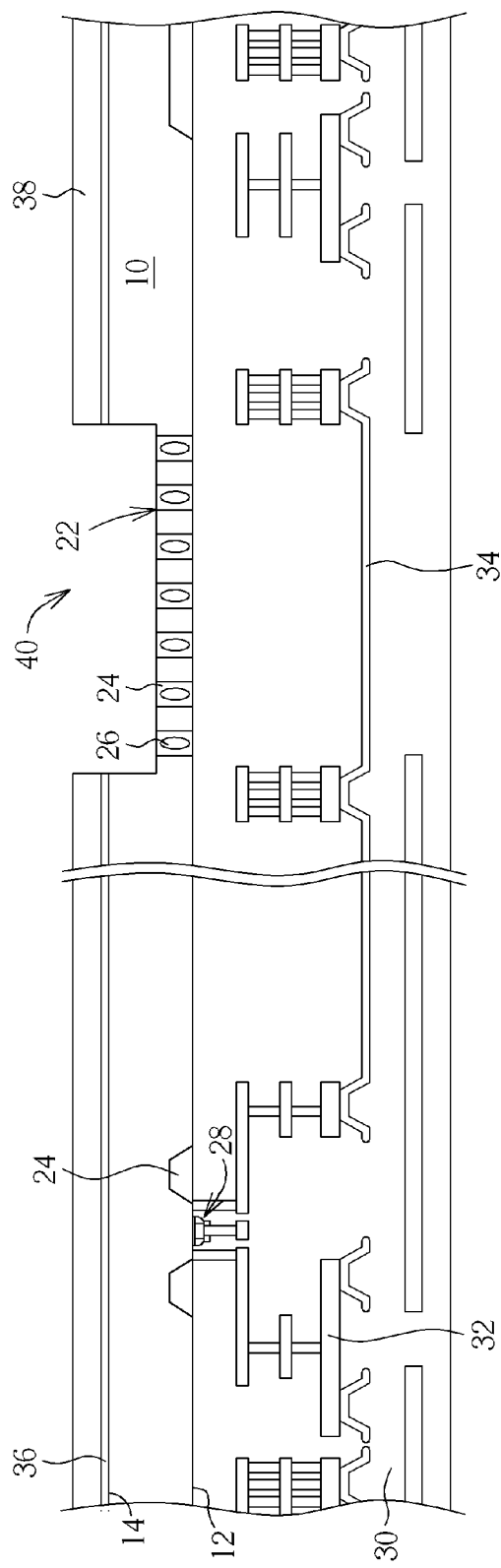

FIG. 1 to FIG. 8 are diagrams schematically depicting the method of fabricating a MEMS microphone. As shown in FIG. 1, a substrate 10 having a first surface 12 such as an active area on the wafer, and a second surface 14 such as a backside of the wafer is provided. The substrate 10 is divided into at least a logic region A and at least a MEMS region B. The substrate 10 can be a single crystalline substrate, a multiple crystalline substrate or a silicon on insulator substrate.

A mask layer 17 is formed on the first surface 12 of the substrate 10. The mask layer 17 may be a multiple layer formed by a pad oxide layer 16 and a silicon nitride layer 18. The pad oxide layer 16 is positioned under the silicon nitride layer 18. The pad oxide layer 16 can be formed by an oxidation process or a chemical deposition process, and the silicon nitride layer 18 can be formed by a chemical deposition process. The pad oxide layer 16 is for absorbing and dispersing the stress caused by the formation of the silicon nitride layer 18. Then, a patterned photoresist (not shown) is formed to cover the first surface 12 of the substrate 10 within the MEMS region B, and expose part of the silicon nitride layer 18 within the logic region A. The silicon nitride layer 18 and the pad oxide layer 16 are etched to transfer the pattern on the patterned photoresist onto the pad oxide 16 and the silicon nitride layer 18. Next, the patterned photoresist is removed. Then, the first surface 12 of the substrate 10 within the logic region A is etched by taking the pad oxide layer 16 and the silicon nitride layer 18 as a mask, and at least one shallow trench 20 is formed. The shallow trench 20 is for isolating the device in the logic region A formed in the following process. According to a preferred embodiment, the depth d1 of the shallow trench 20 is smaller than 1 μm. The depth d1 is the distance between the bottom of the shallow trench 20 and the first surface 12 of the substrate 10.

As shown in FIG. 2, another patterned photoresist (not shown) is formed to cover the first surface 12 of the substrate 10 within the logic region A and expose part of the silicon nitride layer 18 within the MEMS region B. Then, an etching process is performed to transfer the pattern on the patterned photoresist onto the silicon nitride layer 18 and the pad oxide layer 16. Next, a plurality of first trenches 22 is formed by etching the first surface 12 of the substrate 10 and taking the patterned photoresist, pad oxide layer 16 and the silicon nitride layer 18 as a mask. Each of the first trenches 22 will serve as part of the vent pattern of the MEMS microphone. According to a preferred embodiment of the present invention, the first trenches 22 can be formed by a deep reactive ion etching process, but their method of formation is not limited to this process. Other etching processes such as a plasma etching process can also be applied to the present invention. The depth of each of the first trenches can be controlled by the etching time. The depth d2 of each of the first trenches 22 is preferably 20 μm. A space S is between each of the first trenches 22, and the space S is 3 to 20 μm, i.e. each of the first trenches 22 is 3 to 20 μm distant from each other. The depth d2 is defined as the distance between the bottom of one of the first trenches 22 to the first surface 12 of the substrate 10.

According to another preferred embodiment, the formation sequence of the first trenches 22 and the shallow trench 20 can be exchanged. For example, after the pad oxide 16 and the silicon nitride layer 18 are formed, the pad oxide 16 and the silicon nitride layer 18 within the MEMS region B are patterned to serve as a mask. Then, the first surface 12 of the substrate 10 within the MEMS region B is etched to form the first trenches 22. After that, the pad oxide 16 and the silicon nitride layer 18 within the logic region A is patterned to serve as a mask. Then, the substrate 10 within the logic region A is etched to form the shallow trench 20.

As shown in FIG. 3, then, an isolating material 24 such as silicon oxide fills into the shallow trench 20 and the first trenches 22. As shown in FIG. 4, the isolating material 24 is planarized by taking the silicon nitride layer 18 as a stop layer. Please note that, because the aspect ratio of the first trenches 22 may be high, an overhang will occur when the isolating material 24 fills into the first trenches 22. Therefore, a cavity is formed in the first trenches 22. However, in the present invention, the depth d2 and the space S of the first trenches 22 is controlled. Therefore, even though the cavity 26 is formed in the first trenches 22, the cavity 26 resides at the middle of each of the first trenches 22, and is therefore surrounded by the isolating material 24. Furthermore, because the cavity 26 is at the middle of the first trenches 22, the cavity 26 can be encapsulated by the isolating material 24 even after the isolating material 24 is planarized.

As shown in FIG. 5, the silicon nitride layer 18 and the pad oxide layer 16 are removed. A logic device 28 such as a MOS transistor, or a CMOS transistor is subsequently formed on the first surface 12 of the substrate 10. Then, a salicide process is performed optionally. For example, a salicide block layer (not shown) such as silicon oxide, silicon nitride or other dielectric materials is formed entirely on the first surface 12 of the substrate 10 within the MEMS region B and the logic region A. The at least a part of the salicide block layer within the logic region A is removed. Later, a metal layer (not shown) such as Ni, Co, Pt, Pd, Mo, Ti, any combination thereof or an alloy thereof is formed on the first surface 12 of the substrate 10 within the logic region A and the remanding salicide block layer within the MEMS region B. After that, a salicide process is preformed to the metal layer to form a silicide layer on the signal input or output such as the source, the drain, the gate of the logic device 16 and the exposed substrate 10. The metal layer and the salicide block layer are then removed.

A plurality of inter-metal dielectric layers 30 is formed on the first surface 12. The inter-metal dielectric layer 30 can be silicon oxide or any low-k insulation material, and the inter-metal dielectric layer 30 can be a single structure or multiple structures. Furthermore, metal interconnections 32 such as contact plugs and metal wires are formed in the inter-metal dielectric layer 30 within the logic region A and MEMS region B. The formation of the inter-metal dielectric layer 30 and the metal interconnections 32 can be repeated until a completed metal interconnection in the inter-metal dielectric layer is formed. At the same time, a MEMS device such as a diaphragm 34 within the MEMS region B can also be formed together with the metal interconnections 32. The diaphragm 34 serves as the vibration film of the MEMS microphone. In addition, the logic device 16 connects electrically to the diaphragm 34 through the metal interconnections 32. Alternatively, the diaphragm 34 can be made of polysilicon by other semiconductor process performed in the front-end-of-line.

As shown in FIG. 6, the substrate 10 is turned over. The second surface 14 of the substrate 10 is polished optionally to thin the thickness of the substrate 10. Next, a silicon oxide layer 36 is formed optionally and entirely on the second surface 14 of the substrate 10. After that, a patterned mask 38 such as a photoresist or a hard mask is formed on the second surface 14 of the substrate 10 within the logic region A and the MEMS region B where a second trench will form is exposed through the patterned mask 38.

As shown in FIG. 7, the second surface 14 of the substrate 10 is etched to form a second trench 40 by taking the isolating material 24 in the first trenches 22 as an etching stop layer. Alternatively, the depth of the second trench 40 can be controlled by the etching time. The second trench 40 communicates with each of the first trenches 22. Then, the patterned mask 38 is removed. According to a preferred embodiment of the present invention, the second trench 40 can be formed by a deep reactive ion etching process. Moreover, as mentioned above, the cavity 26 is surrounded by the isolating material 24 entirely, and the cavity 26 resides under the surface of the isolating material 24 for a suitable depth. Therefore, even after the second trench 40 is formed, the cavity 26 is still encapsulated by the isolating material 24, and the cavity 26 is not exposed. Until the isolating material 24 is removed, the cavity 26 is removed simultaneously.

Figure 8:
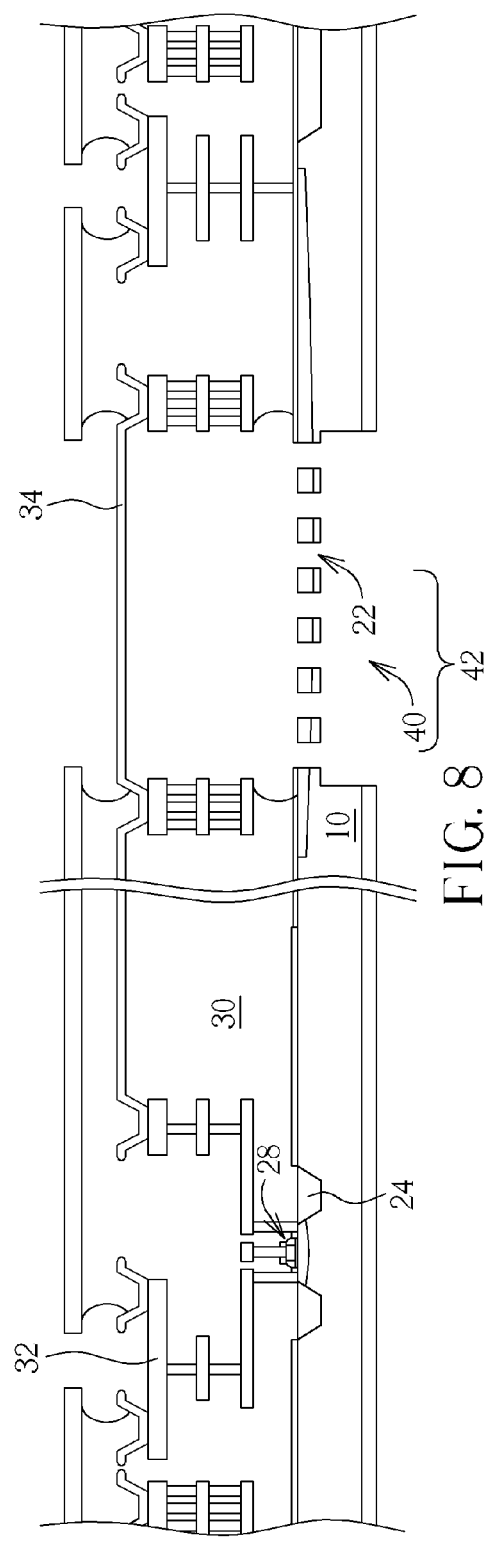

Please refer to FIG. 8. A patterned mask (not shown) is formed optionally to cover the logic region A, and an etching process, such as an isotropic wet etching or vapor etching process, is performed to remove the inter-metal dielectric layer 30 surrounding the diaphragm 34, and the isolating material 24 in the first trenches 22. The diaphragm 34 is thereby suspended. The first trenches 22 and the second trench 40 constitute a vent pattern 42 so as to allow free movement of air molecules. This means the diaphragm 34 can vibrate due to the acoustic waves from outside, or the diaphragm 34 can itself transfer acoustic waves to the outside through vibrating. The substrate 10 between each of the first trenches 22 serves as the backplate electrode of the microphone. The patterned mask is removed later. An elastic layer (not shown) is applied optionally onto the diaphragm 34 to make the diaphragm 34 have a better elasticity. The elastic layer may comprise (for example) plastic rubber, Teflon, Pyralene (Trade name, a chemical compound of polychlorinated biphenyls), or polyamide. At this point, the MEMS microphone of the present invention is completed.

The feature of the present invention is that the vent pattern is not formed by only etching the backside of the substrate. On the contrary, the vent pattern is formed by etching the front side of the substrate to form a plurality of first trenches and by etching the backside of the substrate to form a second trench. Therefore, the undercut between the first trenches and the substrate is prevented. Furthermore, the second trench of the present invention is formed by taking the isolating material in the first trenches as the etching stop layer. Moreover, compared to the conventional method, the present invention forms the vent pattern from both the front side and the backside, and therefore the fabricating time of the vent pattern can be reduced.

Those skilled in the art will readily observe that numerous modifications and alterations of the device and method may be made while retaining the teachings of the invention.

What is claimed is:
1. A method of fabricating a MEMS microphone, comprising:

providing a substrate comprising a first surface and a second surface, the substrate having at least a logic region and at least a MEMS region;

etching the first surface of the substrate to form a plurality of first trenches within the MEMS region;

before forming the first trenches, etching the first surface of the substrate to form at least one third trench in the logic region, wherein the step of forming the first trench and the third trench comprises:

forming a mask layer on the first surface of the substrate;

performing a first patterning process to pattern the mask layer to form a first patterned mask layer;

taking the first patterned mask layer as a first mask to etch part of the first surface within the logic region to form the third trench;

performing a second patterning process to pattern the first patterned mask layer to form a second patterned mask layer; and taking the second patterned mask layer as a second mask to etch part of the first surface within the MEMS region to form the first trenches;

forming an insulating material in each of the first trenches;

etching the second surface of the substrate to form a second trench in the MEMS region by taking the insulating material in the first trenches as an etching stop layer, wherein the second trench communicates with each of the first trenches; and removing the insulating material in each of the first trenches.

2. The method of fabricating a MEMS microphone of claim 1, wherein the mask layer comprises a pad oxide layer and a silicon nitride layer positioned from bottom to top.

3. The method of fabricating a MEMS microphone of claim 1, wherein the method of forming the insulating material in each of the first trenches comprises:

forming the insulating material on the first surface of the substrate and filling into each of the first trenches and the third trench;

planarizing the insulating layer by taking the mask layer as a stop layer; and removing the mask layer.

4. The method of fabricating a MEMS microphone of claim 1, further comprising:

before forming the second trench:

forming a logic device on the first surface within the logic region; and forming an interlayer dielectric layer on the first surface of the substrate, the logic device, and the insulating material, wherein the interlayer dielectric layer comprises a plurality of metal interconnections and a diaphragm, and the logic device connects to the diaphragm electrically through the metal interconnections.

5. The method of fabricating a MEMS microphone of claim 4, wherein when the insulating material in the first trenches is removed, part of the dielectric layer within the MEMS region is also removed.

6. The method of fabricating a MEMS microphone of claim 4, further comprising:

after the metal interconnections and the diaphragm are formed and before the second trench is formed:

thinning the substrate from the second surface; and forming a silicon oxide layer on the second surface after thinned.

7. The method of fabricating a MEMS microphone of claim 1, wherein the depth of each of the first trenches is 20 μm.

8. The method of fabricating a MEMS microphone of claim 1, wherein each of the first trenches is 3 to 20 μm distant from each other.

9. The method of fabricating a MEMS microphone of claim 2, wherein the depth of the third trench is smaller than 1 μm.

10. The method of fabricating a MEMS microphone of claim 1, further comprising:

forming a cavity in one of the first trenches due to overhang.

* * * * *

UNITED STATES PATENT AND TRADEMARK OFFICE
CERTIFICATE OF CORRECTION

| | | |
|---|---|---|
| PATENT NO. | : 8,865,500 B2 | Page 1 of 1 |
| APPLICATION NO. | : 12/699797 | |
| DATED | : October 21, 2014 | |
| INVENTOR(S) | : Chien-Hsin Huang et al. | |

It is certified that error appears in the above-identified patent and that said Letters Patent is hereby corrected as shown below:

On the title page, item(54) and in the Specification, column 1, correct the title of invention from "METHOD OF FABRICATING A MEMS MICROPHONE WITH TRENCHES SERVING AS VENT PATTERN" to --METHOD OF FABRICATING MEMS MICROPHONE WITH TRENCHES SERVING AS VENT PATTERN--.

Signed and Sealed this
Tenth Day of February, 2015

Michelle K. Lee
*Deputy Director of the United States Patent and Trademark Office*